(12) United States Patent
Pahl et al.

(10) Patent No.: US 8,098,001 B2
(45) Date of Patent: Jan. 17, 2012

(54) COMPONENT WITH REDUCED TEMPERATURE RESPONSE, AND METHOD FOR PRODUCTION

(75) Inventors: Wolfgang Pahl, Munich (DE); Hans Krueger, Munich (DE); Werner Ruile, Munich (DE)

(73) Assignee: EPCOS AG, Munich (DE)

( * ) Notice: Subject to any disclaimer, the term of this patent is extended or adjusted under 35 U.S.C. 154(b) by 59 days.

(21) Appl. No.: 12/700,446

(22) Filed: Feb. 4, 2010

(65) Prior Publication Data

US 2010/0187949 A1   Jul. 29, 2010

Related U.S. Application Data

(63) Continuation of application No. PCT/EP2008/060417, filed on Aug. 7, 2008.

(30) Foreign Application Priority Data

Aug. 8, 2007  (DE) .......................... 10 2007 037 502

(51) Int. Cl.
*H01L 41/08* (2006.01)
(52) U.S. Cl. ......... 310/346; 310/328; 310/367; 310/368
(58) Field of Classification Search .................. 310/312, 310/328, 346, 367, 368
See application file for complete search history.

(56) References Cited

U.S. PATENT DOCUMENTS

| | | | |
|---|---|---|---|
| 3,898,585 A * | 8/1975 | Heidrich et al. ................ 372/96 |
| 5,325,012 A * | 6/1994 | Sato et al. ...................... 310/364 |
| 6,037,707 A * | 3/2000 | Gailus et al. ................... 310/363 |
| 6,249,074 B1 * | 6/2001 | Zimnicki et al. .............. 310/312 |
| 6,563,133 B1 | 5/2003 | Tong |
| 7,034,433 B2 | 4/2006 | Kadota et al. |
| 7,067,956 B2 * | 6/2006 | Imai et al. ................. 310/313 D |
| 7,148,769 B2 | 12/2006 | Takano |
| 7,208,860 B2 | 4/2007 | Kadota et al. |
| 7,307,369 B2 | 12/2007 | Yokota et al. |
| 7,332,410 B2 | 2/2008 | Tong |
| 7,569,976 B2 * | 8/2009 | Tamura et al. ................ 310/346 |
| 7,589,452 B2 | 9/2009 | Hauser et al. |
| 7,880,371 B2 * | 2/2011 | Benslimane et al. ......... 310/367 |
| 2002/0003385 A1 * | 1/2002 | Jones ............................ 310/334 |
| 2003/0141502 A1 | 7/2003 | Tong |
| 2003/0151329 A1 | 8/2003 | Kadota et al. |
| 2005/0200434 A1 | 9/2005 | Takano |
| 2006/0016275 A1 * | 1/2006 | Gravesen et al. ......... 73/862.042 |
| 2006/0043822 A1 * | 3/2006 | Yokota et al. ............. 310/313 R |
| 2006/0055283 A1 | 3/2006 | Kadota et al. |

(Continued)

FOREIGN PATENT DOCUMENTS

DE   10 2004 045 0181 A1   3/2006

(Continued)

OTHER PUBLICATIONS

Piezoceramic Materials, 2011, www.piceramic.com, info@piceramic.de., pp. 14-20.*

(Continued)

*Primary Examiner* — Thomas Dougherty
(74) *Attorney, Agent, or Firm* — Slater & Matsil, L.L.P.

(57) ABSTRACT

A component has a substrate and a compensation layer. A lower face of the substrate is mechanically firmly connected to the compensation layer. The lower face of the substrate and the upper face of the compensation layer have a topography.

28 Claims, 2 Drawing Sheets

U.S. PATENT DOCUMENTS

| | | |
|---|---|---|
| 2006/0112537 A1 | 6/2006 | Kadota et al. |
| 2007/0140875 A1* | 6/2007 | Green .................. 417/413.2 |
| 2007/0182290 A1* | 8/2007 | Guo et al. ................ 310/367 |
| 2007/0296306 A1 | 12/2007 | Hauser et al. |

FOREIGN PATENT DOCUMENTS

| | | | |
|---|---|---|---|
| EP | 1 580 885 A1 | | 9/2005 |
| JP | 03-271443 | | 12/1991 |
| JP | 6-241811 A | * | 9/1994 |
| JP | 2001-053579 | * | 2/2001 |
| JP | 2001-332041 A | * | 11/2001 |
| JP | 2002-330047 A | * | 11/2002 |
| JP | 2003-110392 A | * | 4/2003 |
| JP | 2005-089229 | * | 4/2005 |

OTHER PUBLICATIONS

The Engineering ToolBox, Coefficients of Linear Expansion, 2011, www.engineeringtoolbox.com/linear-expansion-coefficients-d_95.html. 5 total pages, 1/5-5/5.*

Markunas, R., "Temperature Compensation Enhances Piezoelectric Substrate's Performance," www.rfdesign.com, Microwave Millimeter Technologies, Jan. 1, 2004, pp. 1-6, Penton Media, Inc.

* cited by examiner

COMPONENT WITH REDUCED TEMPERATURE RESPONSE, AND METHOD FOR PRODUCTION

This application is a continuation of co-pending International Application No. PCT/EP2008/060417, filed Aug. 7, 2008, which designated the United States and was not published in English, and which claims priority to German Application No. 10 2007 037 502.8 filed Aug. 8, 2007, both of which applications are incorporated herein by reference.

BACKGROUND

One disadvantage that is characteristic of SAW filters is their frequency drift as a function of the temperature. This influence has a tendency to increase with the electro-acoustic coupling factor of the piezoelectric substrate that is used. For applications in which high selectivity between closely adjacent channels is important, for example, in the case of US PCS duplexers, conventional substrates such as $LiTaO_3$ are not suitable for complying with the stringent requirements over a wide temperature range (for example, −40° C. to +85° C.). With a typical temperature coefficient of the mid-frequency (TCF, temperature coefficient of frequency) of ≈−42 ppm/K, this is, in this case, varied by more than 0.5%.

German patent document 10 2004 045 181 A1 discloses a SAW component with a reduced temperature response, in which an $SiO_2$ layer is applied over the component structures in order to compensate for the temperature response, and the substrate is connected to a compensation layer on the lower face. The additional layers and processing steps increase the production variation of the product, and therefore, of course, also increase the costs.

U.S. Pat. No. 6,563,133 B1 discloses an SAW component in which a wafer bonding method is used for connection of the substrate to a compensation wafer. For this method, the surfaces of the substrate and of the compensation wafer to be connected must be extremely highly smooth and must be extremely free of particles. Furthermore, special ion implantation techniques and plasma activations are required.

SUMMARY

In one aspect, the present invention specifies a component that has a reduced temperature response without this making other component characteristics excessively worse.

In another aspect, the temperature response of a component can be improved using less complex means than in the past, in particular, with regard to the treatment and quality of the surfaces to be connected.

The invention proposes a component in which the desired effect of a minimized temperature response is achieved without the disadvantages normally associated with this occurring at the same time.

The component according to the invention has a substrate which is mechanically firmly connected on the lower face to a compensation layer. The surfaces to be connected to one another, the lower face of the substrate and the upper face of the compensation layer, each have a topography.

The thermal coefficient of expansion TCE1 of the substrate is advantageously greater than the thermal coefficient of expansion TCE2 of the compensation layer.

The topography on the lower face of the substrate and on the upper face of the compensation wafer, which are referred to in the following text as the two layers to be connected, has the advantage that an appropriately chosen topography leads to an increase in the surface areas of the two layers to be connected. Furthermore, the topography results in a form of tooth system, or in the two layers to be connected engaging in one another.

In addition, $LiTaO_3$ and $LiNbO_3$, and also other piezoelectric crystals may be used as the substrate. By way of example glass, $LiTaO_3$, glass ceramic, quartz, silicon, $ZrO2$, $Al_2O_3$, sapphire, SiC or $B_4C$ are suitable for the compensation wafer. These materials are in each case monocrystalline or polycrystalline, as amorphous glass or ceramic.

This results in mechanical bracing of the piezoelectric substrate, with the bracing resulting in a change in the elastic parameters, in the opposite sense to their temperature-dependent change. This bracing in this case acts, in particular, via the shape of the topography of the surfaces to be connected, and which are in consequence referred to as the joint surfaces. This therefore leads to a reduction in the temperature response of component parameters which vary with the expansion of the substrate, in particular, the temperature response to frequency of the electro-acoustic components.

The substrate of the component according to the invention can be adhesively bonded to the compensation wafer. However, other possible methods (joining, bonding, melting, gluing, sintering) may be used for connection of the substrate to the compensation wafer.

When choosing the adhesive to be used, it is advantageous to match the characteristics of the adhesive to the thickness of the adhesive joint and the roughness of the surfaces to be connected.

Two characteristics are advantageous for the choice of the adhesive: if the adhesive used has a modulus of elasticity $>2*10^9 N/m^2$ (at room temperature) and the glass transition temperature of the adhesive is at least 85° C., preferably more than 125° C.

In principle, suitable adhesives are based on epoxy resin, polyimide, acrylate, silicone resin, polyester resin, or else high-melting-point thermoplastics such as polyphenylene sulfide, or LCP (Liquid Crystal Polymers). Mineral lute of cement are also suitable.

In order to increase the modulus of elasticity, the adhesive can be filled. By way of example, metals, oxides, carbides or nitrides are highly suitable for this purpose. The particle sizes are less than the desired thickness of the adhesive layer, that is to say preferably less than 1 µm.

Furthermore, thin fibers composed of the materials, glass or carbon, are correspondingly suitable for this purpose. These are preferably oriented along or parallel to the acoustic propagation direction. So-called "nanotubes" composed of carbon are considered to be particularly advantageous. The modulus of elasticity of carbon in the form of "nanotubes" has a comparable value to that of diamond.

The topography on the lower face of the substrate and on the upper face of the compensation layer is easily produced in the form of a suitably high roughness on the two joint surfaces. This roughness allows the "uneven areas" which form the roughness, projections and depressions, to engage in one another, thus resulting in bracing of the two layers when temperature changes occur. For this purpose, it is necessary for the mean distance between the substrate and the compensation layer to be less than the roughness amplitude of the two joint surfaces. The lower the ratio of the mean distance to the roughness amplitude, the better is the action of the tooth system, and the better the bracing that can be achieved. By way of example, advantageous ratios have values of less than 0.5 and preferably less than 0.25.

In addition to the roughness, profiles which engage in one another on the surfaces are also suitable. These can be formed by material application to both sides (for example, by vapor deposition, sputtering, electroplating, printing or comparable methods), by material removal on both sides (for example, by sawing, drilling, grinding, sand blasting, erosion, laser bombardment, etching or comparable methods), or by a combination of them.

In order to produce the component according to the invention, initial thicknesses from 30 to 500 µm for the substrate and 100 to 500 µm for the compensation wafer are preferred. After the adhesive bonding process, the sandwich can be thinned down on one side or both sides to an overall thickness of 100-500 µm. The substrate then preferably has a thickness which is less than half the overall thickness.

The described method can be combined with other known methods in order to achieve a reduction in the TCF.

BRIEF DESCRIPTION OF THE DRAWINGS

The invention will be explained in more detail in the following text with reference to exemplary embodiments and the associated figures. The figures are intended to illustrate the invention, and are therefore only schematic and not to scale. Identical parts are annotated with the same reference symbols.

FIG. 3b shows a component obtained after the connection of the two layers as shown in FIG. 3a;

FIG. 4b shows a component obtained after the connection of the two layers shown in FIG. 4a;

FIG. 5b shows a component obtained after the connection of the two layers shown in FIG. 5a.

The following list of reference symbols may be used in conjunction with the drawings:
  1 Substrate
  2 Compensation layer
  3 Lower face of the substrate 1
  4 Upper face of the compensation layer 2
  5 Component structures
  6 Joint
  7 Intermediate layer
  8 Structures
  71 Raised structures
  72 Structures in the form of depressions

DETAILED DESCRIPTION OF ILLUSTRATIVE EMBODIMENTS

Figure 1:
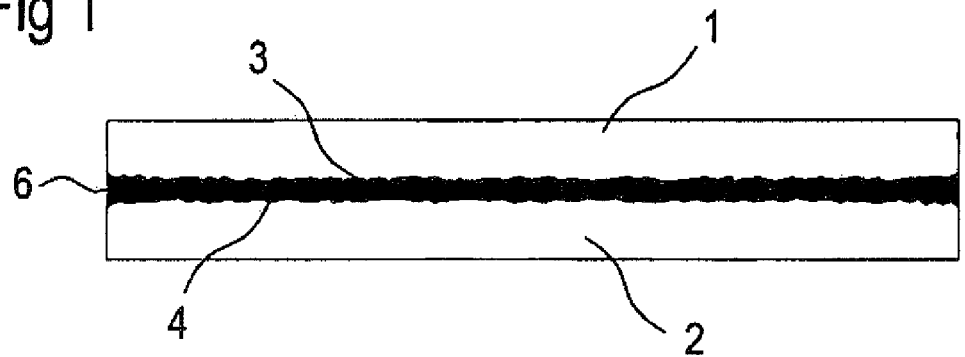
FIG. 1 shows a first component with a non-optimum topography.

FIG. 1 shows a schematic cross sectional view of a first component. The roughness amplitude of the two joint surfaces 3, 4 in this component is inadequate in comparison to the thickness of the joint 6. In consequence, it is not possible to transmit a sufficiently high shear stress through an adhesive layer between the substrate 1 and the compensation wafer 2 in order to satisfy the desired stress conditions.

Figure 2:
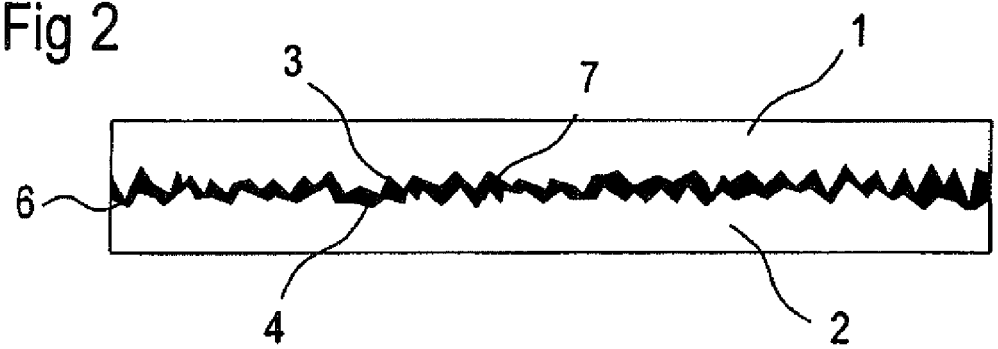
FIG. 2 shows a first component according to the invention, with a suitable topography.

FIG. 2 shows a schematic cross-sectional view of a first component according to the invention, in which the thickness of the adhesive joint is of a suitable size relative to the roughness of the two joint surfaces. The joint surfaces 3, 4 are designed in such a way that the surface profiles repeatedly mesh with one another. The adhesion can be produced under pressure, in which case the illustrated tooth system can result in point mechanical contact between the joint surfaces. The thickness of the intermediate layer 7 then tends to zero at these points.

Figure 3A:
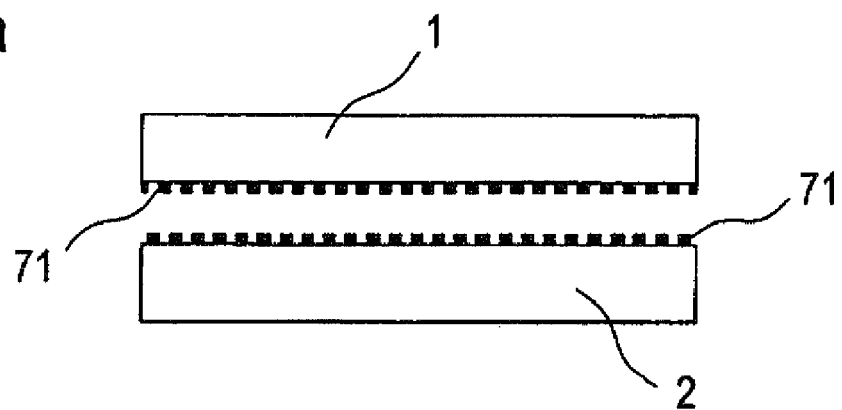
FIG. 3a shows a substrate and a compensation layer with structures which have been produced by material application.

FIG. 3a shows a further possible embodiment of the topography of the joint surfaces of the component according to the invention, in the form of a schematic cross-sectional view, in which periodically regular structures 71 with a period of preferably a few tens to a few hundred micrometers have been produced on the two joint surfaces, for example, by material application to both sides. The structures on the two joint surfaces are of such a type that the structures 71 can mesh with one another. The illustrated structures 71 have a rectangular shape, although other possible shapes which contribute to increasing the surface area can also be used. The height of the structures is preferably in a range from 1 to 50 µm.

Figure 3B:
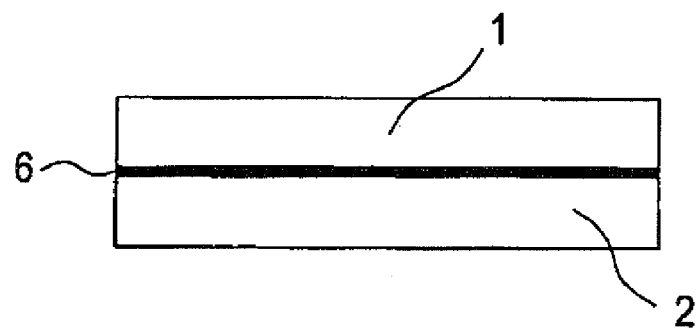

FIG. 3b shows a schematic cross-sectional view of a component according to the invention, in which the substrate 1 and the compensation wafer 2 are mechanically connected to one another as shown in FIG. 3a. As can be seen as well, the structures in this embodiment match one another with an accurate fit, thus resulting in a maximum contact area between the two connected surfaces.

Figure 4A:
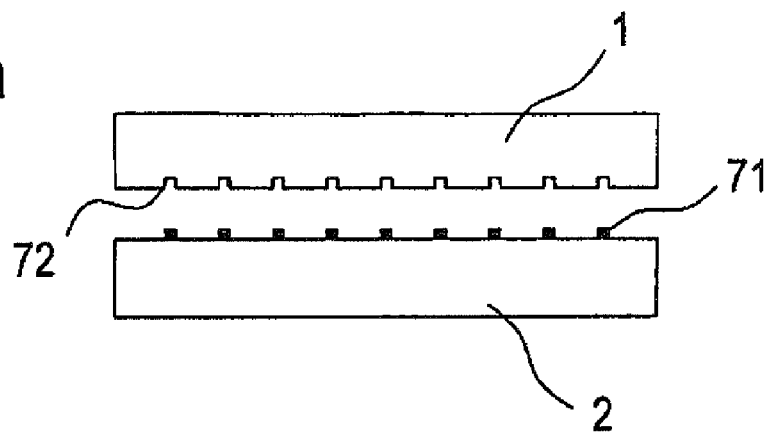
FIG. 4a shows a substrate and a compensation layer with structures which have been produced by material application and material removal.

FIG. 4a shows one possible embodiment of the topography on the joint surfaces of the component according to the invention, in the form of a schematic cross-sectional view, in which periodically regular structures 71 with a period of preferably several tens to several hundred micrometers are produced on one of the two joint surfaces, but preferably not necessarily by material application methods.

The other of the two surfaces to be connected has structures 72 which are preferably, but not necessarily, created by material removal, and are arranged such that they are complementary to the structures 71 on the mating face. The structures 71, 72 on the two joint surfaces are arranged in such a way that they can mesh with one another. In this case, they have a rectangular cross-sectional shape, although other possible shapes which contribute to increasing the surface area may also be used.

Figure 4B:
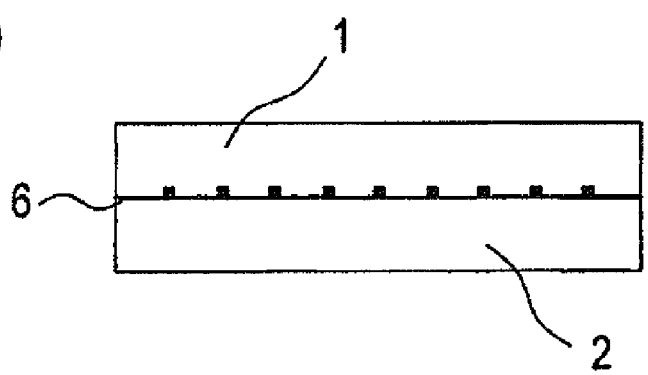

FIG. 4b shows a schematic cross-sectional view of a component according to the invention, in which the substrate 1 and the compensation wafer 2 are mechanically connected to one another as shown in FIG. 4a.

Figure 5A:
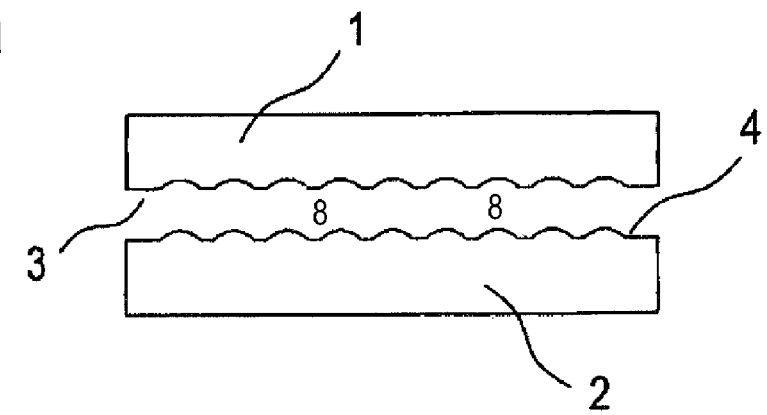
FIG. 5a shows a substrate and a compensation layer with structures which were produced by material removal.

FIG. 5a shows one possible embodiment of the topography of the joint surfaces of the component according to the invention in the form of a schematic cross-sectional view, in which periodically regular structures 8 with a period of preferably several tens to several hundred micrometers have been formed on the two joint surfaces 3, 4 by material removal from both sides. The structures 8 on the two joint surfaces 3, 4 are of such a type that the structures 8 can mesh with one another, and in particular can engage in one another with an accurate fit. The embodiment shown here has a wave pattern on the two joint surfaces, with this wave pattern having been formed in a complementary manner on both of the joint surfaces 3, 4. Further structures can also be used for this purpose which contribute to an increase in the surface area and fit one another in a complementary manner. Irregular and non-periodic structures are also suitable, but these are preferably designed to be complementary to one another.

The structures may optionally be in the form of points or may have some alternative shape, as elongated structures which run in straight lines, curved or in the form of waves, or which run parallel to one another. To this extent, the structure has an anisotropic form and should be oriented such that the stress component in the acoustic propagation direction is maintained. By way of example, in the case of SAW components, a groove profile or elongated structures 8 should run at right angles to the propagation direction of the surface acoustic wave in order to achieve a maximum number of structures, which are hooked or fitted to one another, on the substrate and compensation wafer, along the propagation direction.

Figure 5B:
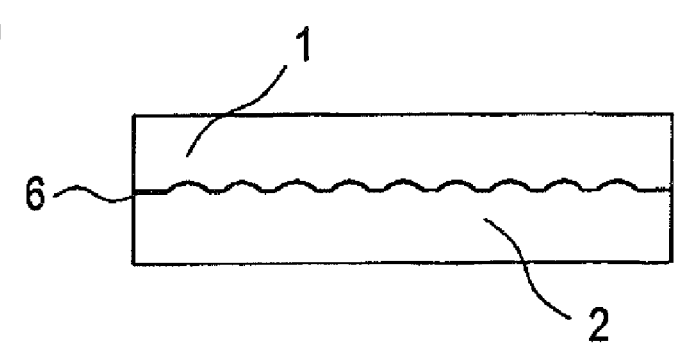

FIG. 5b shows a schematic cross-sectional view of a component according to the invention, in which the substrate 1 and the compensation wafer 2 are mechanically connected to one another as shown in FIG. 5a.

One exemplary embodiment provides component structures on an outer face which are used as transducer structures for excitation and outputting of surface acoustic waves. In addition, component structures can be provided to form, for example, MEMS, BAW or SAW components. In particular, these are component structures whose specifications are adversely affected by thermal longitudinal expansion and which are positively influenced by an advantageous form of the topography of the joint surfaces of the substrate and compensation wafer.

Although the invention has been described only with reference to a small number of exemplary embodiments, it is not restricted to these embodiments. Possible variations result from the nature and form of the compensation layer, of the intermediate layer, from the precise configuration of the component structures. All the embodiments have the common feature that, with the specified features according to the invention, they achieve a considerable improvement in the temperature dependency, in particular, with respect to the resonant frequency, without any individual measure having to be completely removed for this purpose, and having to accept the disadvantage associated with this. The invention therefore specifies a component which has an excellent component performance and a considerably improved or reduced temperature dependency of the component characteristics, for example, at the resonant frequency.

What is claimed is:

1. An electrical component, the component comprising:
   a substrate comprising component structures and a first thermal coefficient of expansion;
   a compensation layer having an upper face that is mechanically firmly connected to a lower face of the substrate,
   wherein the lower face of the substrate and the upper face of the compensation layer have a topography, and wherein the topography results in a tooth system formed by the lower face of the substrate and the upper face of the compensation layer such that a temperature change results in a mechanical bracing of the lower face of the substrate and the upper face of the compensation layer.

2. The component as claimed in claim 1, wherein a material of the compensation layer has a second thermal coefficient of expansion that is less than the first thermal coefficient of expansion.

3. The component as claimed in claim 1, wherein the substrate has piezoelectric characteristics.

4. The component as claimed in claim 1, wherein electrically conductive component structures are arranged at an upper face of the substrate, the upper face opposite the lower face.

5. The component as claimed in claim 4, wherein the lower face of the substrate and the upper face of the compensation layer each have a topography such that the topography in each case has structures selected from projections and recesses, such that the upper face and the lower face engage in one another.

6. The component as claimed in claim 5, wherein the topography has an asymmetric and irregular roughness.

7. The component as claimed in claim 1, further comprising an intermediate layer arranged between the substrate and the compensation layer, the intermediate layer being thinner than the compensation layer.

8. The component as claimed in claim 7, wherein the intermediate layer comprises an adhesive layer.

9. The component as claimed in claim 7, wherein the intermediate layer comprises mineral glue or cement.

10. The component as claimed in claim 7, wherein the intermediate layer comprises metal.

11. The component as claimed in claim 1, wherein the lower face of the substrate and the upper face of the compensation layer each have a topography which is formed by structured material application or material removal.

12. The component as claimed in claim 11, wherein the topography formed by material application or removal is periodically regular and has a period of 10 to 100 µm.

13. The component as claimed in claim 11, wherein the topography has a height in the range from 1 to 50 µm.

14. The component as claimed in claim 11, wherein the structures of the topography comprise Ti, Ni, Cr, Cu, a ceramic material or a glass-like material.

15. The component as claimed in claim 8, wherein the adhesive layer has a modulus of elasticity of $>2*10^9$ N/m$^2$, and a glass transition temperature occurs at at least +85° C.

16. The component as claimed in claim 1, wherein the component is a SAW, BAW or MEMS component.

17. A method for producing a component, the method comprising:
   mechanically connecting a lower face of a substrate which has a first thermal coefficient of expansion to an upper face of a compensation wafer which has a compensation layer,
   wherein the lower face of the substrate and the upper face of the compensation wafer each have structures that form a topography, and wherein the topography results in a tooth system formed by the lower face of the substrate and the upper face of the compensation layer such that a temperature change results in a mechanical bracing of the lower face of the substrate and the upper face of the compensation layer.

18. The method as claimed in claim 17, wherein the compensation layer has a second thermal coefficient of expansion that is less than the first thermal coefficient of expansion.

19. The method as claimed in claim 17, wherein the substrate comprises a material with piezoelectric characteristics.

20. The method as claimed in claim 17, further comprising forming electrically conductive component structures at an upper face of the substrate, the upper face opposite the lower face.

21. The method as claimed in claim 17, wherein the substrate and the compensation layer are connected with the aid of an intermediate layer.

22. The method as claimed in claim 21, further comprising forming the structures by material application, the material application comprising vapor deposition, sputtering, electroplating or printing.

23. The method as claimed in claim 21, further comprising forming the structures by material removal, the material removal comprising etching, sawing, drilling, grinding, sand blasting, erosion or laser bombardment.

24. The method as claimed in claim 21, further comprising forming the structures by a combination of material application and material removal.

25. The method as claimed in claim 24, wherein the structures comprise recesses formed by material removal and projections formed by material application, the recesses and the projections configured to engage in one another when connected.

26. The method as claimed in claim 21, wherein the topography comprises an irregular roughness such that a roughness amplitude on the upper face of the compensation wafer and on the lower face of the substrate is greater than a mean thickness of the intermediate layer.

27. The method as claimed in claim 25, further comprising thinning down one or more sides of the component, wherein the component has an overall thickness of 100-500 μm after being thinned down.

28. The method as claimed in claim 27, wherein the substrate has an original thickness prior to being connected to the compensation wafer and the substrate is thinned down to at least half the original thickness.

* * * * *